United States Patent [19]

Beriger et al.

[11] 4,037,045

[45] July 19, 1977

[54] APPARATUS FOR COOLING ELECTRICAL DEVICES

[75] Inventors: Conrad Beriger, Aarau; Reinhard Müller, Baden, both of Switzerland

[73] Assignee: BBC Brown Boveri & Company Limited, Baden, Switzerland

[21] Appl. No.: 632,679

[22] Filed: Nov. 17, 1975

[30] Foreign Application Priority Data

Dec. 6, 1974 Switzerland .................. 16216/74

[51] Int. Cl.² ........................................... H01G 3/03
[52] U.S. Cl. ................................. 174/15 R; 165/39; 357/82; 361/379; 361/385
[58] Field of Search ............ 174/15 R, 15 C, DIG. 5; 357/82; 317/100; 165/39

[56] References Cited

U.S. PATENT DOCUMENTS

| 2,162,740 | 6/1939 | Mirick | 357/82 |
| 2,189,617 | 2/1940 | Siebert et al. | 357/82 |
| 2,783,418 | 2/1957 | Peter et al. | 357/82 |
| 2,917,685 | 12/1959 | Wiegand | 357/82 |
| 3,291,889 | 12/1966 | Uline et al. | 174/15 R X |
| 3,400,543 | 9/1968 | Ross | 174/15 R |
| 3,965,971 | 6/1976 | Roggenkamp | 174/15 R X |

*Primary Examiner*—Arthur T. Grimley
*Attorney, Agent, or Firm*—Werner W. Kleeman

[57] ABSTRACT

An apparatus for cooling electrical devices by means of a flowing medium, comprising auxiliary electrodes arranged to both sides of an electrical device to be cooled and to both sides of further devices of an active recirculation cooling system. The electrical device to be cooled is at a first potential and the further devices at a second potential. The auxiliary electrodes are at least partially located in branch conduits branching-off main conduit means of the recirculation cooling system.

20 Claims, 5 Drawing Figures

APPARATUS FOR COOLING ELECTRICAL DEVICES

BACKGROUND OF THE INVENTION

The present invention relates to a new and improved construction of apparatus for cooling electrical devices or components by means of a flowing medium, preferably but not exclusively water, wherein the potential difference between the electrically conductive components in contact with a coolant or cooling agent appears at auxiliary electrodes which essentially possess the same potential as the electrically conductive components.

Such type apparatus (cf. German Pat. No. 938,197) prevents the appearance of a voltage between the auxiliary electrode and the conductive components to be cooled. Since the auxiliary electrodes are situated closer together than the components to be cooled the removal of current-conducting particles, for instance dissolved anode material, separated oxygen and so forth, predominantly occurs at the auxiliary electrodes. Accordingly, in the first instance electrolytic corrosion also takes place at the auxiliary electrodes, not at the conductive components to be cooled.

The gases, such as for instance $H_2$, $O_2$, formed by electrolysis at the auxiliary electrodes, with the state-of-the-art cooling devices are initially transferred to the coolant stream, in order to be then, if desired, removed by means of a filter mounted in the main conduit of the recirculation cooling system. In this connection attention is directed to, for example, U.S. Pat. No. 2,917,685.

SUMMARY OF THE INVENTION

Hence, it is a primary object of the present invention to provide a new and improved construction of apparatus for cooling electrical devices or components which is not associated with the aforementioned drawbacks and limitations of the prior art proposals.

Another and more specific object of the present invention aims at the provision of a new and improved construction of cooling apparatus which functions in a reliable and efficient manner, requires a small expenditure in filters, and gas present at the auxiliary electrodes is already removed from the active recirculation cooling system at the situs where such gas is formed.

Now in order to implement these and still further objects of the invention, which will become more readily apparent as the description proceeds, the cooling apparatus of this development is manifested by the features that the auxiliary electrodes are arranged to both sides of the device to be cooled which is at a first predetermined potential and to both sides of further devices of the active recirculation cooling system which are at a second predetermined potential. The auxiliary electrodes are at least partially located in auxiliary or branch conduits which branch-off from a main conduit or main conduit means of the recirculation cooling system.

With this novel apparatus the gases forming at the auxiliary electrodes are flushed away into the auxiliary or branch conduits, so that the coolant or cooling agent in the main conduit means is practically free of gas.

In order to prevent the effects of turbulence from flushing gases forming at the auxiliary electrodes into the main conduit means, an advantageous constructional manifestation of the invention contemplates preferably constructing the auxiliary electrodes to possess a substantially ring-shaped or annular configuration. The inner diameter of each such ring-shaped auxiliary electrode is essentially equal to the diameter of the associated auxiliary or branch conduit. Further, means are arranged in the auxiliary conduit in such a manner that the velocity of the coolant or cooling agent at the region of the auxiliary electrode is greater than at the remaining portion of the auxiliary or branch conduit.

A further possibility of preventing such flushing of gases into the main conduit means contemplates constructing the auxiliary electrodes so as to possess a large surface or area and arranging in each relevant branch conduit a bundle of tubes formed of electrically insulating material between the main conduit means and the associated auxiliary electrode, the individual tubular members or tubes of each such bundle or bunch of tubes possessing a length-diameter ratio which is greater than 5.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE INVENTION

Figure 1:
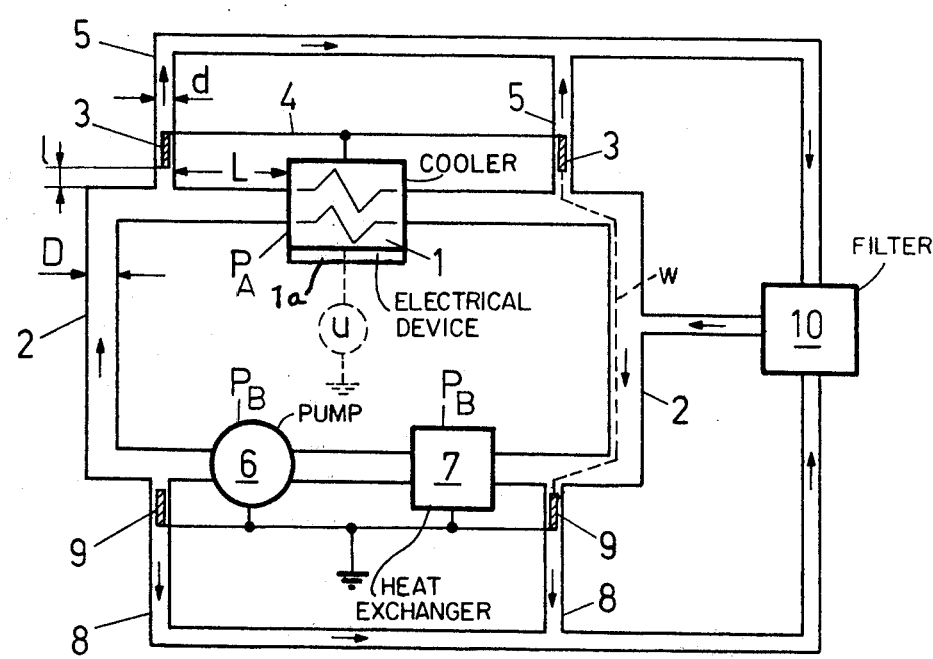
FIG. 1 is a schematic illustration of a closed recirculation cooling system having the auxiliary electrodes arranged in branch conduits which branch-off the main or primary conduit means.

Describing now the drawings, in FIG. 1 reference character 1 schematically illustrates a metallic cooler or cooling device, for instance the cooling plates of a power thyristor generally indicated by reference character 1a and constituting an electrical device to be cooled. This cooling device directly comes into contact with a suitable cooling agent or medium, preferably water, flowing through the main cooling system constituted by the main conduit or conduit means 2. The cooler 1 and the device 1a are at a first electrical potential $P_A$. In front of and behind i.e., upstream and downstream of the cooler 1 there are arranged two auxiliary electrodes 3 which are at the same electrical potential $P_A$ as the cooler or cooling device 1, and which auxiliary electrodes 3 are connected in circuit with the cooler or cooling device 1 by means of an electrical conductor or line 4. Both of the auxiliary electrodes 3 are located in each instance in a branch or auxiliary conduit 5 branching-off from the main conduit means 2.

Continuing, reference character 6 designates a conventional circulation pump which serves the purpose of pumping the coolant or cooling agent so as to flow with sufficient rapidity or speed through the main conduit means 2 and therefore also through the cooler or cooling device 1. Reference character 7 designates a heat exchanger. The components 6 and 7 are part of the active recirculation cooling system. Both the pump 6 and the heat exchanger 7 are at a second potential $P_B$ and in the exemplary embodiment under discussion are earthed or grounded. Before and after i.e., upstream and downstream of both of these devices or components there are located two branch conduits or lines 8 which likewise branch-off from the main or primary conduit means 2 and in which there are again arranged auxiliary electrodes 9. These auxiliary electrodes 9 are also at ground potential.

By virtue of the new and improved construction of apparatus of this development there is achieved the beneficial result that any electrolysis of the coolant brought about by the potential difference U does not take place at the conductive parts of the cooler 1 or the pump 6 and the heat exchanger 7, rather at the auxiliary electrodes 3 and 9 respectively. Gases thus forming at the auxiliary electrodes 3 and 9 are flushed away via the branch conduits 5 and 8, respectively, by means of the coolant which also enters these conduits. With the aid of a filter 10 this branched-off portion of the coolant can be then freed of gases and then after passing through a conventional pump which has not been particularly illustrated in FIG. 1 to preserve clarity in illustration, is again delivered into the main or primary conduit means 2. This additional or booster pump insures for a sufficient excess pressure of the coolant freed of the gases in relation to the coolant flowing through the main conduit means.

The diameter d of the branch conduits or lines 5, 8 as well as the diameter D of the main conduit or main conduit means 2 are dimensioned such that there flows through the branch conduits 5, 8 less than 20% of the coolant flowing through the main conduit means 2.

In order to insure for a small electrolysis current which may be possibly present at the cooler 1 it is advantageous to design the system such that the value A expressed by the following equation satisfies the following relationship:

$$A = \frac{L}{D^2} : \frac{l}{d^2} > 10,$$

and is preferably equal to about 100. In this regard, and as best recognized by referring to FIG. 1, reference character L designates the spacing between the cooler 1 and the branch conduit 3 and the pump 6 or the heat exchanger 7 and the branch conduit 8 respectively, and reference character 1 the spacing between the auxiliary electrodes 3 or 9 respectively and the main conduit means 2.

All of the conduits are formed of a good insulating material, for instance polyvinyl chloride (PVC). As the coolant or cooling agent there is preferably employed deionized water having a conductivity or conductance which is less than $$0.5 \frac{\mu S}{cm}.$$

Also especially useful as the coolant or cooling agent are mixtures of water and a non-electrolyte, such as for instance water soluble alcohols, polyalcohols, acetone and lower ketones. By means of such type mixtures it is possible to improve both the cooling properties as well as also the viscosity of the cooling agent or coolant. The shortest spacing W (FIG. 1) along the course of the main conduit means and auxiliary conduit between the auxiliary electrodes 3 at the potential $P_A$ and the auxiliary electrodes 9 at ground potential ($P_E$) is determined by the relationship: $W \geq U/1000$, wherein $U = |P_A - P_E| = |P_A|$ is in volts and W is in centimeters. It will be recalled that in the embodiment under discussion $P_B$ is equal to $P_E$.

With this apparatus water which is practically free of gas flows through the cooler 1 so that there cannot occur any reaction of the conductive parts of the cooler with for instance oxygen formed by electrolysis.

In this way there is prevented the formation of metal oxides and metal hydroxides, for instance Cuo, FeOH, which otherwise could be formed and would markedly contaminate the recirculation system. Contamination of the recirculation system then, among other things, would result in a large hydraulic pressure drop and additionally attendant therewith poor heat transfer.

Figure 2:
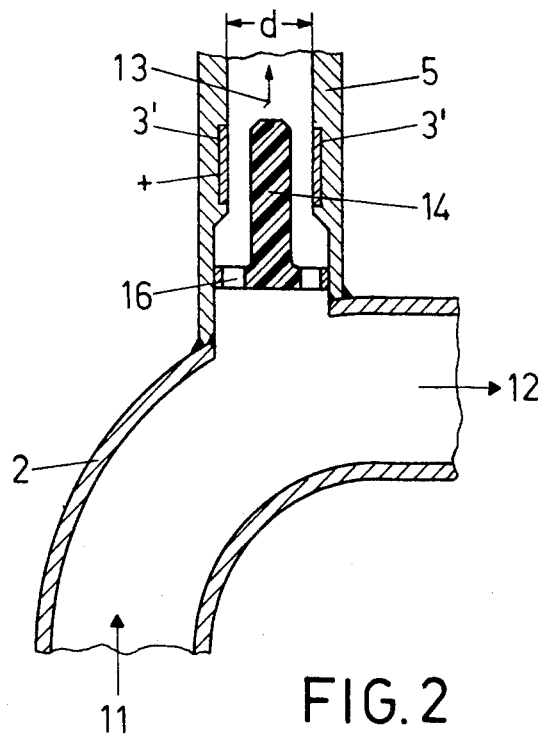
FIG. 2 is a fragmentary cross-sectional view showing details of an arrangement possessing a substantially ring-shaped auxiliary electrode.
Figure 2A:
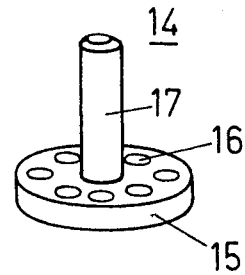
FIG. 2a is a perspective view of a substantially punch-shaped or plunger-shaped member or part for increasing the flow velocity of the coolant at the region of an auxiliary electrode; as used in the arrangement of FIG. 2

Continuing, FIG. 2 illustrates a possible arrangement of, for example, the auxiliary electrode 3 (FIG. 1) in the branch conduit 5. The arrows 11 and 12 indicate the direction of flow of the coolant in the main conduit means 2, the arrow 13 the direction of flow of the coolant stream in the branch conduit 5 which flushes away the decomposition gases. The auxiliary electrode, here designated by reference character 3', possesses the shape of a substantially annular or ring-shaped member, wherein the inner diameter of such ring-shaped member essentially corresponds to the diameter d of the branch conduit 5. In order to prevent flushing-in of anodic reaction products, for instance dissolved anode material of the auxiliary electrode, removed or separated out oxygen and so forth, into the main coolant stream due to turbulence —for instance by virtue of the deflection of the main coolant stream— there is provided a punch member or plunger 14 (FIG. 2a) formed of an electrically insulating material. In the base plate or piston 15 of the plunger or punch member 14 there are arranged a number of bores or apertures 16 through which can flow the coolant into the branch conduit 5. With this arrangement the handle or rod 17 of the plunger 14 is located internally of the hollow annular-shaped auxiliary electrode 3' and at this location produces an actual reduction in the cross-sectional area of the branch or auxiliary conduit 5. The increased coolant velocity at the neighborhood of the auxiliary electrode 3' brought about by this reduction in the cross-sectional area, causes a rapid removal or transporting away of the gases in the direction of the arrow 13 and which gases form at the auxiliary electrode 3'.

Figures 3, 3A:
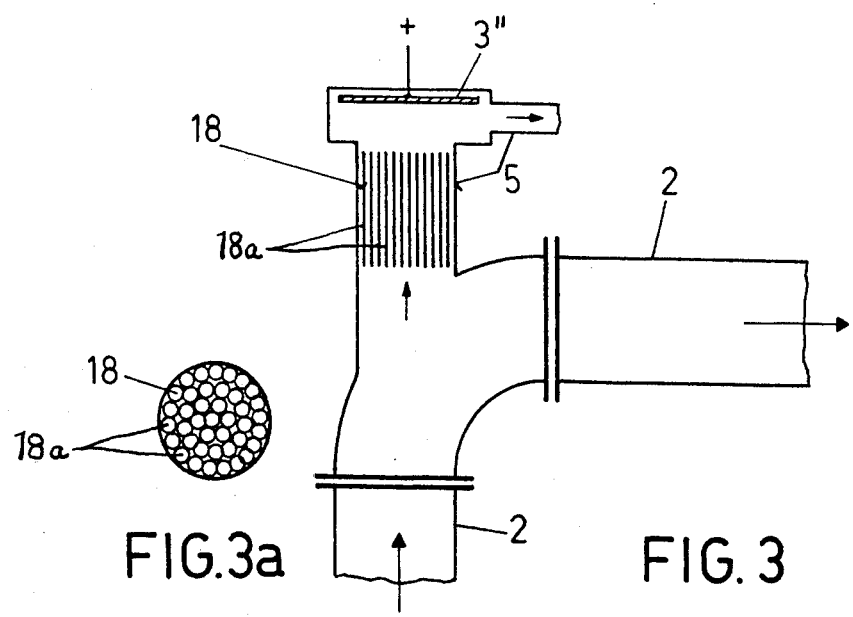
FIG. 3 schematically illustrates in fragmentary view a further possible arrangement, as contemplated by the invention, incorporating a substantially flat configured auxiliary electrode and a diaphragm or membrane disposed between the auxiliary electrode and the main or primary conduit means.
FIG. 3a schematically illustrates in plan view the diaphragm or membrane used in the arrangement of FIG. 3.

A further possibility of preventing that, by the action of turbulence, gases formed at the auxiliary electrode 3 (FIG. 1) and separated-out particles or deposits collecting at this electrode will be flushed or swept into the main conduit means 2 has been illustrated in the arrangement of FIG. 3. By referring thereto there will be recognized that a diaphragm or membrane 18 is located in front of a large, flat-shaped or areal auxiliary electrode 3". That is to say, there is provided a bundle or bunch of tubes or tubular members 18a (cf. also FIG. 3a) formed of any suitable insulating material having as free as possible surface and large length-diameter ratio (≥ 5), which tube bundle splits-up the branch coolant stream into as large as possible number of small parallel currents or streams without essentially reducing the cross-sectional area of the conduit.

Finally, it is mentioned that the auxiliary electrodes of the various embodiments herein disclosed can be formed, for instance, of a noble or precious metal, preferably gold.

While there are shown and described present preferred embodiments of the invention, it is to be distinctly understood that the invention is not limited thereto, but may be otherwise variously embodied and practiced within the scope of the following claims.

Accordingly, what is claimed is:

1. An arrangement of at least one electrical device and an apparatus for cooling said at least one electrical device by means of a flowing cooling medium, comprising means including main conduit means defining a main recirculation cooling system for a cooling medium flowing in a predetermined direction through the main conduit means, means defining a branch circulation system including branch conduits branching-off from the main recirculation cooling system and through which flows a portion of the cooling medium, said at least one electrical device to be cooled coacting with the main recirculation cooling system, said electrical device being at a first potential, said means defining the main recirculation cooling system including means for bringing about heat transfer at the cooling medium and being at a second potential, auxiliary electrodes arranged upstream and downstream of the electrical device to be cooled with respect to the predetermined direction of flow of the cooling medium through the main recirculation cooling system, said auxiliary electrodes being located at least partially in the branch conduits which branch-off from the main recirculation cooling system.

2. The arrangement as defined in claim 1, wherein said means for bringing about heat transfer at the cooling medium comprises at least one pump means and at least one heat exchanger means.

3. The arrangement as defined in claim 1, wherein the electrical device is at the first potential $P_A$ and the heat transfer means is at the second potential $P_B$, means for connecting in circuit predetermined ones of said auxiliary electrodes with the electrical device in order to place said first predetermined electrodes essentially at the first potential $P_A$, means for connecting in circuit other predetermined ones of said auxiliary electrodes with said heat transfer means to place said other predetermined electrodes essentially at the second potential $P_B$, and the shortest distance W along the course of the main conduit means and branch conduits between the auxiliary electrodes at the potential $P_A$ and the auxiliary electrodes at the potential $P_B$ assumes a value defined by:

$$W \geq U/1000$$

wherein: $U = |P_A - P_B|$ is measured in volts and W is measured in centimeters.

4. The arrangement as defined in claim 1, wherein the diameter $d$ of the branch conduits and the diameter $D$ of the main conduit means are dimensioned such that no more than 20% of the cooling medium flowing through the main conduit means flows through the branch conduits.

5. The arrangement as defined in claim 4, wherein the main recirculation cooling system includes cooler means provided for the electrical device, and the main recirculation cooling system and the branch recirculation system are structured to satisfy the following relationship:

$$A = \frac{L}{D^2} : \frac{l}{d^2} > 10$$

wherein:
L represents the spacing between the cooler means and the next adjacent branch conduit; and
l represents the spacing between the auxiliary electrodes and the main conduit means.

6. The arrangement as defined in claim 5, wherein the value A amounts to approximately 100.

7. The arrangement as defined in claim 4, wherein the main recirculation cooling system and the branch circulation system are structured to satisfy the following relationship:

$$A = \frac{L}{D^2} : \frac{l}{d^2} > 10$$

wherein:
L represents the spacing between the means at the second potential of the main recirculation cooling system and the next adjacent auxiliary conduit; and
l represents the spacing between the auxiliary electrodes and the main conduit means.

8. The arrangement as defined in claim 7, wherein the value of A approximately equals 100.

9. The arrangement as defined in claim 4, wherein the main recirculation cooling system includes cooler means provided for the electrical device, and the main recirculation cooling system and the branch circulation system are structured to satisfy the following relationship:

$$A = \frac{L}{D^2} : \frac{l}{d^2} > 10$$

wherein:
L selectively represents any one of the spacing between the cooler means and the next adjacent auxiliary conduit, the spacing between the means at the second potential of the main recirculation cooling system and the next adjacent auxiliary conduit; and
l represents the spacing between the auxiliary electrodes and the main conduit means.

10. The arrangement as defined in claim 9, wherein the value A amounts to approximately 100.

11. The arrangement as defined in claim 1, wherein each of the auxiliary electrodes possesses a substantially ring-shaped configuration, the inner diameter of each such auxiliary electrode being equal to the diameter $d$ of its associated branch conduit, and means arranged in each branch conduit for increasing the velocity of the cooling medium at the neighborhood of the associated auxiliary electrode to be greater than the velocity of the cooling medium at the remainder of such branch conduit.

12. The arrangement as defined in claim 11, wherein said velocity increasing means comprises a substantially cylindrically symmetrical, rod-shaped insulating body member disposed essentially concentrically with respect to the lengthwise axis of the associated branch conduit and arranged to extend at least partially within the auxiliary electrode of said associated branch conduit.

13. The arrangement as defined in claim 1, wherein each auxiliary electrode possesses a substantially flat surface member arranged in its associated branch conduit, a bundle of tubes formed of insulating material disposed between the main conduit means and the auxiliary electrode in the associated branch conduit, and wherein the length-diameter ratio of the individual tubes of the bundle of tubes amounts to $\geq 5$.

14. The arrangement as defined in claim 1, wherein the cooling medium is water.

15. The arrangement as defined in claim 1, wherein the cooling medium possesses a specific conductivity less than 0.5 μS/cm.

16. The arrangement as defined in claim 1, wherein the cooling medium comprises a mixture of water and a non-electrolyte.

17. The arrangement as defined in claim 16, wherein the non-electrolyte comprises a water soluble alcohol.

18. The arrangement as defined in claim 1, wherein the main conduit means and the branch conduits are formed of polyvinyl chloride and the auxiliary electrodes are formed of a noble metal.

19. The arrangement as defined in claim 18, wherein the noble metal is gold.

20. An apparatus for cooling at least one electrical device by means of a flowing cooling medium, comprising means for providing a main recirculation cooling system for a cooling medium flowing in a predetermined direction through the main recirculation cooling system, means for providing a branch circulation system including branch conduits branching-off from the main recirculation cooling system and through which flows a portion of the cooling medium, auxiliary electrodes arranged upstream and downstream of the device with respect to the predetermined direction of flow of the cooling medium through the main recirculation cooling system, said auxiliary electrodes being located at least partially in the branch conduits which branch-off from the main recirculation cooling system.

* * * * *